United States Patent
Peters et al.

(10) Patent No.: US 7,116,694 B2
(45) Date of Patent: Oct. 3, 2006

(54) TRANSMITTER ARRAY WITH PIXEL ELEMENT THAT HAS PRIMARY SEMICONDUCTOR LASER AND AT LEAST ONE SECONDARY SEMICONDUCTOR LASER

(75) Inventors: Frank H. Peters, San Jose, CA (US); Jonathan Simon, Castro Valley, CA (US)

(73) Assignee: Avago Technologies Fiber IP (Singapore) Pte. Ltd., Singapore (SG)

( * ) Notice: Subject to any disclaimer, the term of this patent is extended or adjusted under 35 U.S.C. 154(b) by 63 days.

(21) Appl. No.: 10/317,480

(22) Filed: Dec. 11, 2002

(65) Prior Publication Data

US 2004/0114655 A1   Jun. 17, 2004

(51) Int. Cl.
*H01S 5/00* (2006.01)
(52) U.S. Cl. .............................. 372/50.12; 372/50.23
(58) Field of Classification Search .............. 372/50.1, 372/50.12–50.122, 50.23
See application file for complete search history.

(56) References Cited

U.S. PATENT DOCUMENTS

| | | | | |
|---|---|---|---|---|
| 5,467,211 | A * | 11/1995 | Haney et al. ................ 398/45 |
| 5,546,209 | A * | 8/1996 | Willner et al. ................ 398/43 |
| 5,612,968 | A * | 3/1997 | Zah ................ 372/50 |
| 5,615,198 | A * | 3/1997 | Kubokawa ................ 369/102 |
| 5,745,152 | A * | 4/1998 | Vincent et al. ................ 347/238 |
| 5,808,657 | A * | 9/1998 | Kurtz et al. ................ 347/239 |
| 5,848,087 | A * | 12/1998 | Iwasa et al. ................ 372/50 |
| 5,985,568 | A * | 11/1999 | Krihak et al. ................ 435/6 |
| 6,049,641 | A * | 4/2000 | Deacon et al. ................ 385/15 |
| 6,144,685 | A * | 11/2000 | Iwasa et al. ................ 372/50 |
| 6,419,404 | B1 * | 7/2002 | Deri et al. ................ 385/89 |
| 6,462,864 | B1 * | 10/2002 | Lange et al. ................ 359/341.1 |
| 6,594,050 | B1 * | 7/2003 | Jannson et al. ................ 398/52 |
| 6,639,201 | B1 * | 10/2003 | Almogy et al. ................ 250/208.1 |
| 6,695,493 | B1 * | 2/2004 | Ciemiewcz ................ 385/89 |
| 6,724,794 | B1 * | 4/2004 | Dudoff et al. ................ 372/45 |
| 6,731,665 | B1 * | 5/2004 | Trezza ................ 372/75 |
| 6,753,197 | B1 * | 6/2004 | Dudoff et al. ................ 438/25 |
| 6,756,258 | B1 * | 6/2004 | Zhang et al. ................ 438/158 |
| 6,775,308 | B1 * | 8/2004 | Hamster et al. ................ 372/28 |
| 6,797,548 | B1 * | 9/2004 | Zhang et al. ................ 438/152 |
| 2002/0145150 | A1 * | 10/2002 | Okuyama et al. ................ 257/91 |
| 2003/0011851 | A1 * | 1/2003 | Trezza ................ 359/173 |
| 2003/0039281 | A1 * | 2/2003 | Trezza ................ 372/43 |
| 2003/0091084 | A1 * | 5/2003 | Sun et al. ................ 372/50 |
| 2003/0123504 | A1 * | 7/2003 | Liu et al. ................ 372/46 |
| 2003/0147652 | A1 * | 8/2003 | Green et al. ................ 398/118 |

OTHER PUBLICATIONS

Tee, C. A. T. H., Crossland, W. A., Collings, N. and Wilkinson, T. D. "A Reconfigurable VCSEL Array Link Suitable For Use in Large Electronic IP Switches", Cambridge University Engineering Department, Technical Digest of OECC 2000, paper PD1-5, pp. 10-11 (Jul. 2000, Makuhari Messe).

* cited by examiner

*Primary Examiner*—James Menefee
*Assistant Examiner*—Phillip Nguyen

(57) ABSTRACT

A transmitter array that has at least one pixel element. Each pixel element includes at least a primary semiconductor laser and a secondary semiconductor laser. In this manner, when the primary semiconductor laser is inoperative, the secondary semiconductor laser is utilized for transmission.

18 Claims, 4 Drawing Sheets

TRANSMITTER ARRAY WITH PIXEL ELEMENT THAT HAS PRIMARY SEMICONDUCTOR LASER AND AT LEAST ONE SECONDARY SEMICONDUCTOR LASER

FIELD OF THE INVENTION

The present invention relates generally to the field of semiconductor lasers, and more particularly, to a transmitter array with at least one pixel element that has a primary semiconductor laser and at least one secondary semiconductor laser.

BACKGROUND OF THE INVENTION

There are an ever-growing number of new applications that use high bandwidth digital and analog electro-optic systems. For example, in digital computing systems, electro-optic systems are often utilized to route signals among processors. In analog systems, electro-optic systems are often utilized in applications, such as phased array radar. Electro-optic systems are also commonly found in applications that switch high bandwidth optical carriers in communication systems.

In these systems, light beams are modulated in a digital and/or analog fashion and are used as "optical carriers" of information. An important component in these systems is the optical source or transmitter. Conventional semiconductor lasers have found widespread use in these systems as the light source of choice. For example, semiconductor lasers are commonly found in communications systems, compact disc players, and many other devices and systems.

Several types of surface emitting lasers have been developed. One commonly known and utilized is referred to as a "vertical cavity surface emitting laser" (VCSEL). VCSELs have many advantages over other types of optical sources. First, VCSELs can be fabricated in arrays with relative ease as compared to edge emitting devices that are not as easily fabricated. For example, an array of VCSELs can be fabricated by growing the desired layers on a substrate and then patterning the layers to form the array. Individual lasers may be separately connected with appropriate contacts. These arrays are useful in diverse applications as, for example, image processing inter-chip communications and optical interconnects.

For certain applications, it is desirable to use large one-dimensional or two-dimensional transmitter arrays. VCSELs can be easily made into one-dimensional and two-dimensional arrays. In fact, nice two-dimensional VCSEL arrays have been demonstrated. Furthermore, localized yields for VCSELs have increased into the high 90% range, thereby making the creation of two-dimensional arrays more practical.

Unfortunately, for very large two-dimensional array, the manufacturing yield issues remain challenging. Specifically, as the number of individual lasers in an array is increased, the probability that at least one of the lasers will not operate correctly due to manufacturing defects also increases. When one assumes that device failures are the result of wafer defects, then one would expect individual VCSELs to have yields as high as 99.6%. However, the expected yield for a 10×10 array is about 67%, while the expected yield for a 20×20 array drops to about 20%. Consequently, achieving acceptable manufacturing yields in large laser arrays is extremely difficult.

It is desirable for there to be a mechanism that increases the manufacturing yield for a VCSEL arrays, especially large VCSEL arrays.

Based on the foregoing, there remains a need for a transmitter array with at least one pixel element that has a primary semiconductor laser and at least one secondary semiconductor laser and that overcomes the disadvantages set forth previously.

SUMMARY OF THE INVENTION

In accordance with the invention, a transmitter array that has at least one pixel element is described. Each pixel element includes a primary semiconductor laser and at least one secondary semiconductor laser. In this manner, when the primary semiconductor laser is inoperative, the secondary semiconductor laser is utilized for transmission. Each pixel element can optionally include driver circuitry that is coupled to the primary semiconductor laser and a secondary semiconductor laser of each pixel element for selectively driving one of the primary semiconductor laser and a secondary semiconductor laser for each pixel element. Each pixel element includes a transmission travel path. Each pixel element can optionally include an alignment mechanism that optically aligns the primary semiconductor laser and the secondary semiconductor laser of each pixel element to a predetermined transmission travel path.

BRIEF DESCRIPTION OF THE DRAWINGS

The present invention is illustrated by way of example, and not by way of limitation, in the figures of the accompanying drawings and in which like reference numerals refer to similar elements.

DETAILED DESCRIPTION

In accordance with the invention, a transmitter array in which each pixel element includes a primary semiconductor laser and at least one secondary semiconductor laser is described. In the following description, for the purposes of explanation, numerous specific details are set forth in order to provide a thorough understanding of the present invention. It will be apparent, however, to one skilled in the art that the present invention may be practiced without these specific details. In other instances, well-known structures and devices are shown in block diagram form in order to avoid unnecessarily obscuring the present invention.

In an embodiment in accordance with the invention, a practical mechanism for achieving large transmitter arrays of semiconductor lasers (e.g., VCSELs) is provided that enables high bandwidth communication with acceptable manufacturing yields by providing transmission arrays in which each pixel element has a primary semiconductor laser and at least one secondary semiconductor laser (hereinafter also referred to as a redundant semiconductor laser). Rather than constructing an array with one transmission element per transmission pixel as in the prior art, the transmitter array in accordance with the invention configures one or more pixel elements in a transmission array with at least two transmission elements (e.g., two semiconductor lasers).

Parallel Optics Module 100

Figure 1:
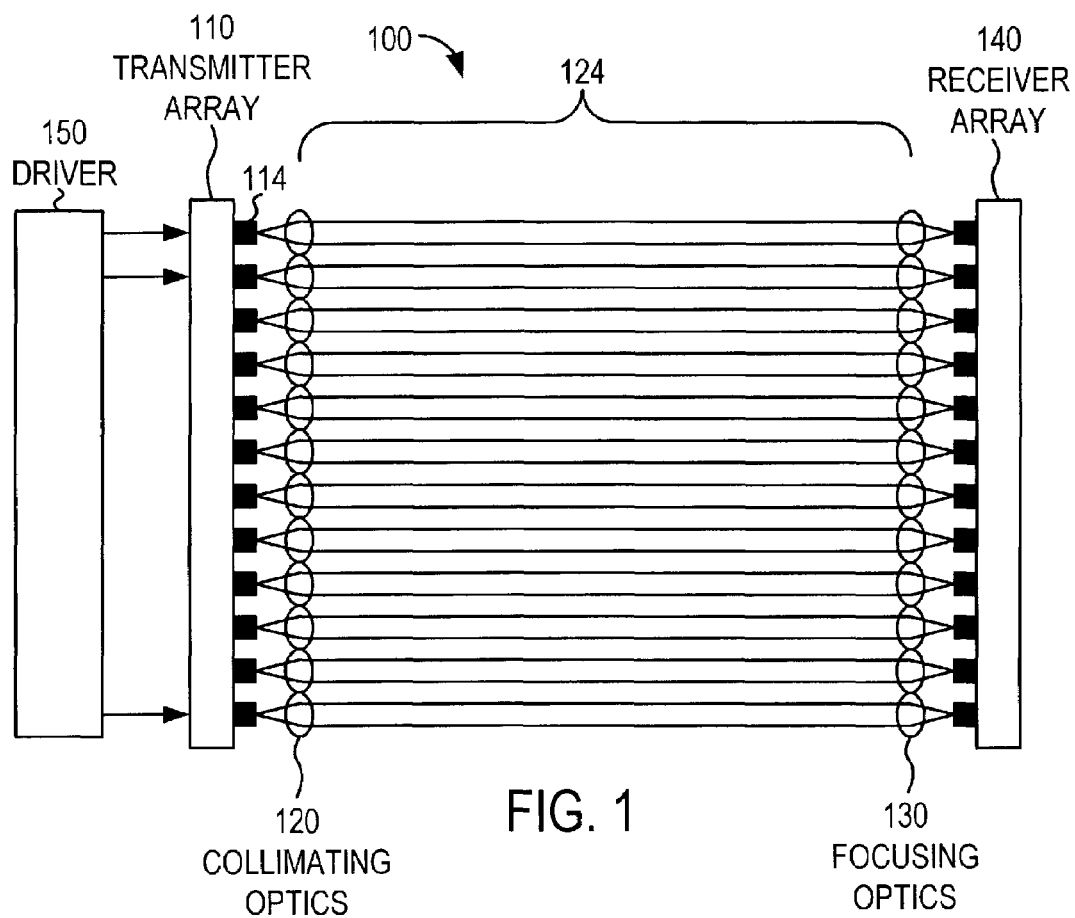
FIG. 1 illustrates an electro-optical system in which the transmitter array of in accordance with the invention can be implemented.

FIG. 1 illustrates a parallel optics module 100 in which the transmission array in accordance with the invention can be implemented. The parallel optics module 100 includes a transmitter array 110, driver circuitry 150, collimating optics 120, transmission medium 124, focusing optics 130, and a receiver array 140.

The transmitter array 110 includes at least one pixel element. In one embodiment, the transmitter array has a plurality of pixel elements. The transmitter array 110 is configured so that each pixel element has a primary semiconductor laser and at least one secondary semiconductor laser (hereinafter also referred to as a redundant semiconductor laser). A transmitter array in which the pixel elements have such a configuration is referred to herein as a "redundant transmitter array" or "redundant array".

Although the embodiments of the redundant transmitter array in accordance with the invention are described herein with reference to the transmitter array 110 including semiconductor lasers or VCSELs as the optical source, it is noted that the redundant transmitter array configuration in accordance with the invention can be applied to any photonic optical source.

By configuring each pixel element to have at least two semiconductor lasers, the array in accordance with the invention increases the manufacturing yields for transmitter arrays, especially large transmitter arrays. Manufacturing yield is increased since the secondary semiconductor lasers may be utilized for transmission when the primary semiconductor laser is inoperative (e.g., inoperative due to manufacturing defects).

Whenever there are two or more semiconductor lasers in each pixel element, it is noted that if the primary semiconductor laser are inoperative, one of the redundant semiconductor lasers may be utilized to transmit information for the pixel element. In other words, when multiple redundant semiconductor lasers are provided for each pixel element, any one of the redundant semiconductor lasers may be employed for transmission when the primary laser is inoperative. For example, in an array of VCSELS, when the first VCSEL in a first pixel is inoperative, the second VCSEL in the first pixel may be utilized for transmission. Similarly, when the second VCSEL in the first pixel is inoperative, the first VCSEL in the first pixel may be utilized for transmission.

When the pixel elements in a transmitter array 110 are configured with the redundancy mechanism in accordance with the invention, the manufacturing yield of the transmitter array 110 of semiconductor lasers may be increased.

It is noted that the transmitter array 110 may be a one-dimensional array of pixel elements 114 (e.g., a 1×N array or a M×1 array), or a two dimensional array of transmitter elements 114 (e.g., an M×N array). Each pixel element includes one or more transmitter elements (e.g., semiconductor lasers) that convert electrical signals into corresponding optical signals.

Optics is provided to direct or steer the beams of light (optical signals) from the transmitter array 110 to the receiver array 120. For example, the optical signals generated by the transmitter array 110 may be collimated by an array 120 of lenses (e.g., microlenses). The lenses may be diffractive lenses, refractive lenses or a combination of diffractive lenses and refractive lenses. After traversing a predetermined distance 124, the optical signals or light beams are focused onto the receiver array 140 by the focusing optics 130, which is typically an array of lenses (e.g., microlenses).

It is noted that the light beams generated by the transmission array 110 follow a predetermined transmission travel path. This path across distance 124 can be, for example, a free-space travel path through free space or a guided travel path through optical fibers, waveguides, or other guides for optical channels. The receiver array 140 includes a plurality of photonic optical detectors (e.g., an array of photodetectors) for receiving a corresponding optical signal or beam and converting the optical signal into a corresponding electrical signal.

Each pixel element can optionally include driver circuitry that is coupled to the primary semiconductor laser and a secondary semiconductor laser of each pixel element for selectively driving one of the primary semiconductor laser and a secondary semiconductor laser for each pixel element.

In one embodiment, the driver circuitry 150 is coupled to the transmitter array 110 for selectively driving one of the VCSELs in each pixel element. In an alternative embodiment, the driver circuitry 150 is integrated with the transmitter array 110. The driver circuitry 150 is described in greater detail hereinafter with reference to FIG. 2.

It is noted that each pixel element has a predetermined transmission travel path. Each pixel element can optionally include an alignment mechanism that optically aligns the primary semiconductor laser and the secondary semiconductor laser of each pixel element to a predetermined transmission travel path. The alignment mechanism can be a passive alignment mechanism or an active alignment mechanism. The transmission travel path can be, for example, a free-space travel path through free space or a guided travel path through optical fibers, waveguides, or other guides for optical channels.

Pixel Element Having Four Closely Packed VCSELs

Figure 2:
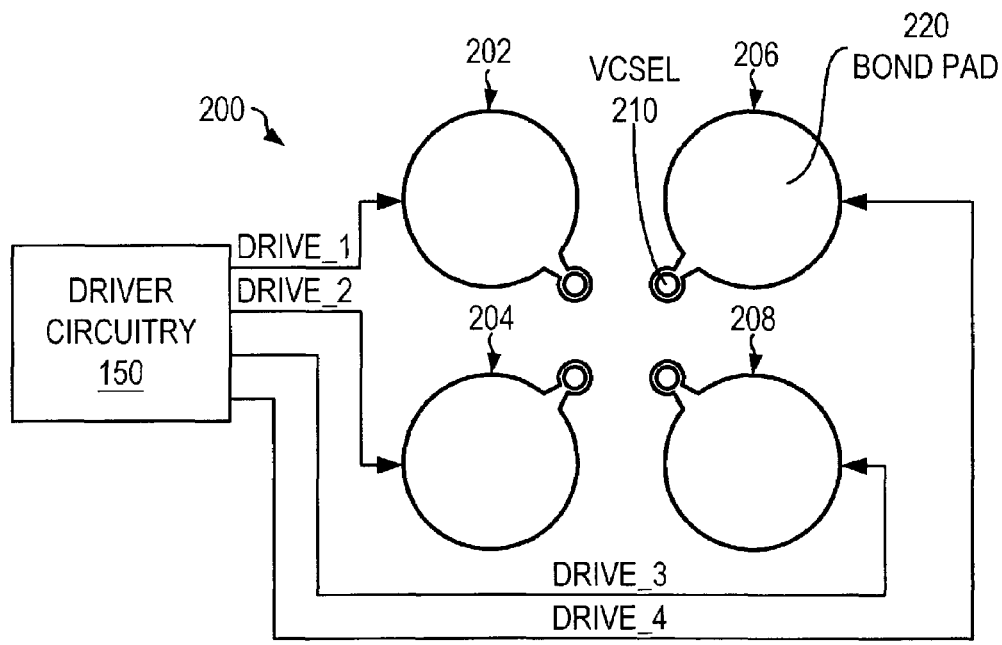
FIG. 2 illustrates a pixel element having three redundant VCSELs in accordance with one embodiment of the invention.

FIG. 2 illustrates a pixel element 200 that includes three redundant VCSEL elements in an embodiment in accordance with the invention. The pixel element 200 has a first VCSEL element 202, a second VCSEL element 204, a third VCSEL element 206, and a fourth VCSEL element 208. Each VCSEL element includes a bond pad (e.g., bond pad 220 for the third VCSEL element 206) and a VCSEL (e.g., VCSEL 210 for the third VCSEL element 206). In one embodiment in accordance with the invention, the first VCSEL element 202, a second VCSEL element 204, a third VCSEL element 206, and a fourth VCSEL element 208 are closely packed.

Each VCSEL element receives a respective drive signal that is provided by the driver circuitry 150. For example, the first VCSEL element 202 receives a first drive signal (e.g., the DRIVE_1 signal), the second VCSEL element 204 receives a second drive signal (e.g., the DRIVE_2 signal), the third VCSEL element 206 receives a third drive signal (e.g., the DRIVE_3 signal), and the fourth VCSEL element 208 receives a fourth drive signal (e.g., the DRIVE_4 signal). The driver circuitry 150 selectively drives one of the drive signals (DRIVE_1 signal, the DRIVE_2 signal, the DRIVE_3 signal, or the DRIVE_4 signal) to activate a corresponding VCSEL element. One of the VCSEL elements may be designated as a primary VCSEL element that is employed during normal operation. When the primary VCSEL element is inoperative for some reason, one of the secondary or back-up VCSEL elements (referred to herein also as a redundant VCSEL elements) is utilized for transmission. In this manner, the manufacturing yield of VCSEL arrays, and especially large VCSEL arrays, is greatly improved.

In the preferred embodiment, the VCSEL array includes a plurality of pixel elements that may be arranged in rows and columns. Each pixel element in the VCSEL array is configured with at least two VCSEL elements (e.g., a primary VCSEL element and a redundant VCSEL element or back-up VCSEL element) in an embodiment in accordance with the invention. The redundancy of VCSEL elements in each pixel greatly increases the manufacturing yield of the large arrays.

By placing the emitting aperture close together within the pixel element, any one of the lasers (e.g., the primary laser or the backup lasers for the particular pixel) can be used for each pixel.

Large VCSEL arrays can be utilized in a wide variety of applications and are especially suitable high bandwidth applications. For example, the redundant VCSEL arrays in accordance with the invention can be used in free space communications systems or in guided wave (e.g., multi-fiber) communication systems.

The term "free space" means that the optical channels of the optical system are freely propagating without imposed lateral confinement. This "free space" system is in contrast with other "guided-wave" systems wherein the optical channels are confined or guided in structures such as optical fiber waveguides and planar optical waveguides.

For both free space optical links and fiber based optical links, the density of the pixels is limited by the size of the lenses or the fibers used to transmit the optical signals. In this regard, the actual lasers can be produced at much higher densities. Consequently, more than one laser can exist within each pixel of the transmitter array 110.

By creating a redundant VCSEL array that employs at least two VCSEL elements in each pixel element, the pixel element configuration in accordance with the invention enables the manufacture of very large laser arrays with a high manufacturing yield.

In an embodiment in accordance with the invention, the primary semiconductor laser and a secondary semiconductor laser for each pixel element are designed to have their apertures tightly packed within the pixel element, thereby ensuring acceptable free space or fiber coupling for free space applications and fiber-based applications, respectively.

Increase in Manufacturing Yield

By using more than one VCSEL per pixel in an array, the VSCEL array in accordance with the invention greatly increases the manufacturing yield for a large array. It is noted that the manufacturing yield increases since only one VCSEL in each pixel needs to operate correctly. The VCSEL to be used for transmission is selected by driver circuitry 220.

Yields for arrays of single VCSELs are calculated as the product of the yields for individual elements. The general formula for determining yield of single-VCSEL pixel arrays is $p^n$, where p is the individual probability of a good pixel, and n is the number of pixels in the array. For example, if there is a 99% probability of obtaining a single VCSEL that is not defective, the probability for a 1×4 array of VCSELs with all VCSELs not defective $0.99 \times 0.99 \times 0.99 \times 0.99 = 0.99^4 = \sim 0.96$. For a 10×10 array, there are 100 VCSELs, so the yield is calculated by the expression $0.99^{100} = 0.366$, or 37%.

The general formula for determining yield for multiple-VCSEL pixel arrays is $(1-q^m)^n$, where q is the probability of a defective subpixel VCSEL, m is the number of subpixels in a pixel (i.e., the number of VCSELs per pixel), and n is the number of pixels. To calculate the yield for arrays where each pixel has 4 sub-pixels (i.e., 4 VCSELs per pixel), the yield for a pixel with 4 sub-elements is first determined. Then, the array yield may be calculated in the same manner as described above. The probability that all 4 sub-pixels (based on 99% yield) are defective is $0.01^4$ or 0.00000001. Consequently, the yield for a 4 element pixel is 99.999999%. A 10×10 array is then is $0.99999999^{100} = 0.999999$, or 99.9999%.

As can be appreciated, when only one VCSEL is required to be operative in each pixel element, and there is more than one VCSEL in each pixel element, the yield per pixel element is far higher than the yield per pixel element when each pixel element has only a single or individual VCSEL.

In another example, there is a 20×20 pixel VCSEL array with 500 µm spacing between pixels. Each pixel element has four tightly packed VCSELs. In this example, even with a 99% percent VCSEL yield, the array yield by utilizing the yield enhancing mechanism and configuration in accordance with invention would be greater than about 99%. In contrast, a prior art array (e.g., a 20×20 array) that uses a single VCSEL per pixel would have an expected yield of about 2%. This exemplary array, configured in accordance with the invention, and operating at 5 Gb/s per pixel has the ability to transmit 2 Tb/s of data in an area slightly larger than 10×10 $cm^2$.

Exemplary VCSEL Array

Figure 3:
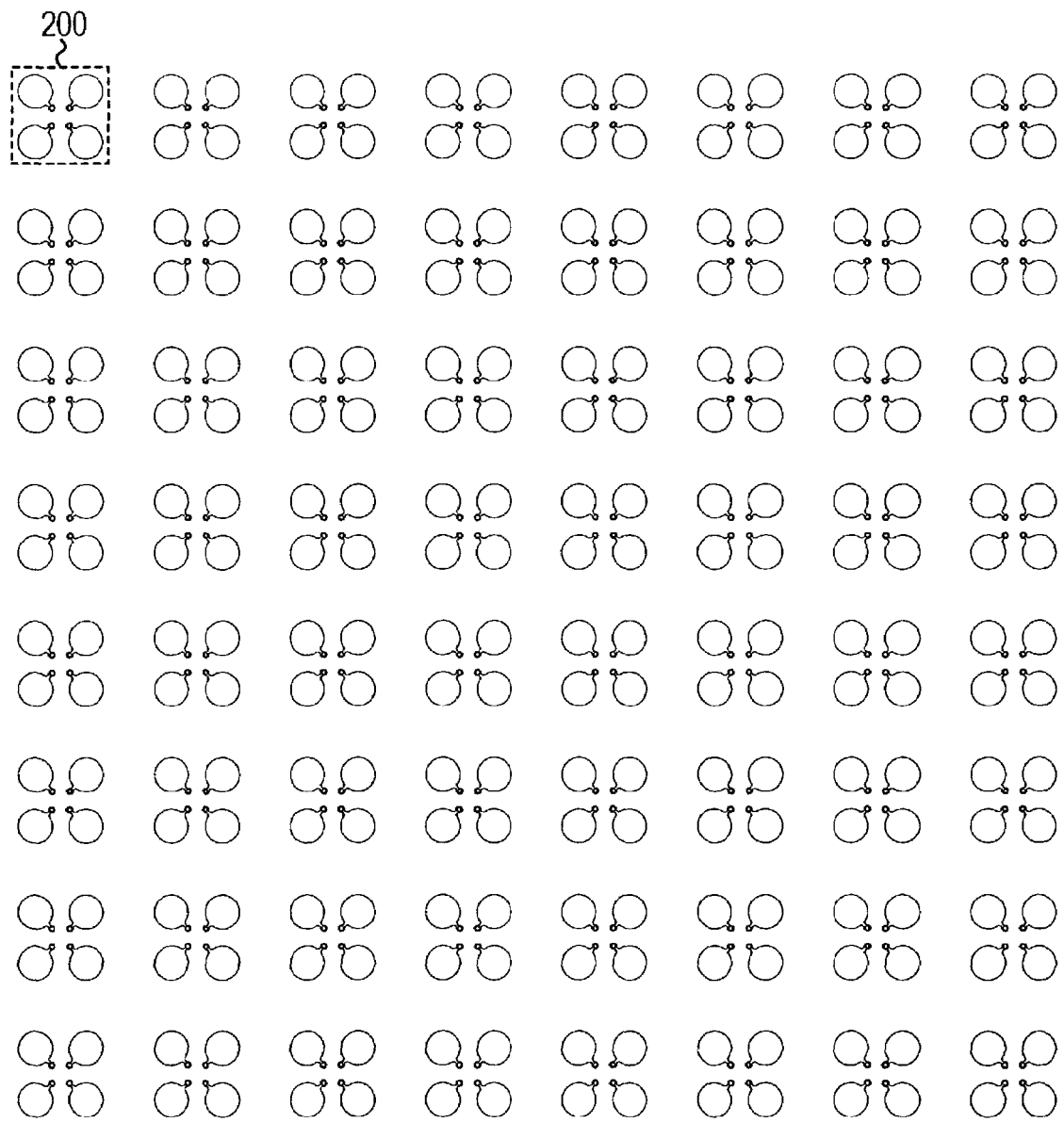
FIG. 3 illustrates an exemplary 8×8 transmitter array using the pixel element of FIG. 2.

FIG. 3 illustrates an 8×8 VCSEL array using the redundant VCSEL element 200 of FIG. 2. In this embodiment, each pixel element 200 has four VCSELs (i.e., three redundant VCSELs). It is to be appreciated that other numbers of VCSELs are possible in each pixel element. It is noted that each pixel element 200 receives a plurality of drive signals (i.e., one drive signal for each VCSEL element in the pixel).

Pixel Element Having Two Closely Packed VCSELs

Figure 4:
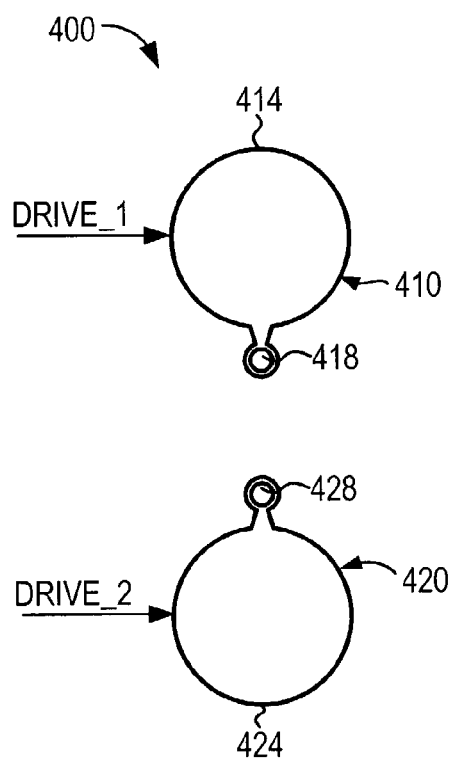
FIG. 4 illustrates a pixel element having two closely packed VCSELs in accordance with another embodiment of invention.

FIG. 4 illustrates a pixel element 400 that includes a primary VCSEL element and single secondary or redundant VCSEL element in accordance with the invention. The pixel element 400 has a first VCSEL element 410 and a second VCSEL element 420. In one embodiment in accordance with the invention, the first VCSEL element 410 and the second VCSEL element 420 are closely packed. The first VCSEL element 410 includes a bond pad 414 and a VCSEL 418. Similarly, the second VCSEL element 420 includes a bond pad 424 and a VCSEL 428. Each VCSEL element receives a respective drive signal that is provided by the driver circuitry 150. For example, the first VCSEL element 410 receives the DRIVE_1 signal and the second VCSEL element 420 receives the DRIVE_2 signal.

Pixel Element Having Three Closely Packed VCSELs

Figure 5:
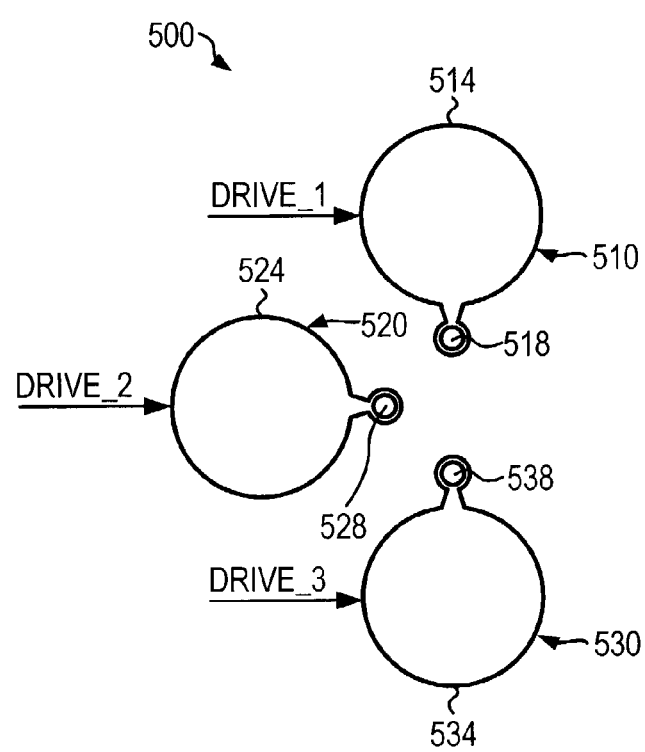
FIG. 5 illustrates a pixel element having three closely packed VCSELs in accordance with yet another embodiment of the invention.

FIG. 5 illustrates a pixel element 500 that includes a primary VCSEL element and two secondary or redundant VCSEL elements in accordance to another embodiment of the invention. The pixel element 500 has a first VCSEL element 510, a second VCSEL element 520, and a third VCSEL element 530. In one embodiment in accordance with the invention, the first VCSEL element 510, the second VCSEL element 520, and the third VCSEL element 530 are closely packed.

The first VCSEL element 510 includes a bond pad 514 and a VCSEL 518. Similarly, the second VCSEL element 520 includes a bond pad 524 and a VCSEL 528. The third VCSEL element 530 includes a bond pad 534 and a VCSEL 538. Each VCSEL element receives a respective drive signal that is provided by the driver circuitry 150. For example, the first VCSEL element 510 receives the DRIVE_1 signal, the second VCSEL element 520 receives the DRIVE_2 signal, and the third VCSEL element 530 receives the DRIVE_3 signal.

VCSEL Element with Adjustable Microlens

Figure 6:
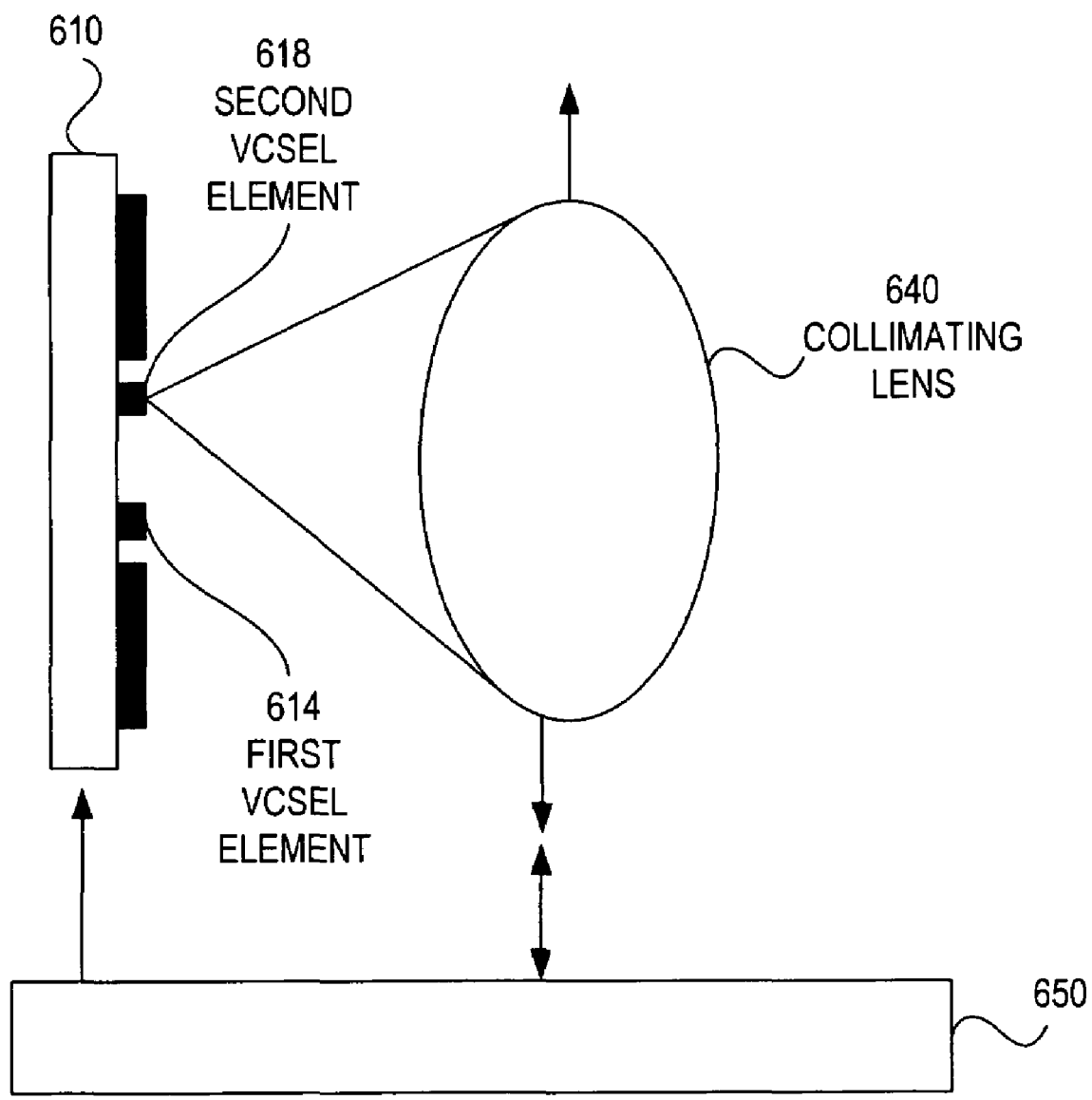
FIG. 6 illustrates a pixel element with an adjustable microlens in accordance with the invention.

FIG. 6 illustrates a schematic of a single pixel element 610 with an adjustable microlens 640. The pixel element 610 includes two optical sources (e.g., a first VCSEL element 614 and a second VCSEL element 618). A collimating lens 640 is provided for the pixel element 610 to ensure proper optical coupling between the first VCSEL element 614 and a second VCSEL element 618 in each pixel element and the free space travel path or guided travel path through a guided optical medium (e.g., optical fiber). Using current processing techniques, it is possible to create independent VCSELs that are separated by less than 10 μm. A mechanism 650 may be provided to adjust the alignment between the VCSEL elements and the optics. For example, active alignment can be utilized to select the VCSEL for use in transmission in each pixel element and to ensure correct optical alignment. In one embodiment in accordance with the invention, an active alignment mechanism, such as is described in "A reconfigurable VCSEL array link suitable for use in large electronic IP switches," by C. A. T. H. Tee, W. A. Crossland, N. Collings and T. D. Wilkinson, Cambridge University Engineering Department, Trumpington Street, Cambridge CB2 1PZ, England (Technical Digest of OECC 2000 (July 2000, Makuhari Messe) paper PD1–5, pp. 10–11), which is hereby incorporated by reference, is utilized to optically couple the first VCSEL element 614 and a second VCSEL element 618 in the current pixel element to a corresponding transmission travel path.

One advantage of the redundant VCSEL array in accordance with the invention is that a new VCSEL may be selected for use in a pixel element when one of the other VCSEL elements has failed. Consequently, the redundancy provided by the transmitter array in accordance with the invention can result in a more reliable link.

In the foregoing specification, the invention has been described with reference to specific embodiments thereof. It will, however, be evident that various modifications and changes may be made thereto without departing from the broader scope of the invention. The specification and drawings are, accordingly, to be regarded in an illustrative rather than a restrictive sense.

What is claimed is:

1. A transmitter array comprising:
   at least one pixel element; wherein each pixel element has at least a primary semiconductor laser and a secondary semiconductor laser;
   a transmission path associated with each pixel element; and
   an alignment mechanism for each pixel element that optically aligns the primary semiconductor laser and the secondary semiconductor laser of each pixel element to a corresponding transmission travel path,
   wherein when the primary semiconductor laser is not operating correctly, the secondary semiconductor laser is utilized for transmission.

2. The transmitter array of claim 1 wherein the transmitter array is coupled to a driver circuitry; wherein the drive circuitry is coupled to the primary semiconductor laser and a secondary semiconductor laser of each pixel element for selectively driving one of the primary semiconductor laser and a secondary semiconductor laser for each pixel element.

3. The transmitter array of claim 1 wherein the alignment mechanism includes one of an active alignment mechanism and a passive alignment mechanism.

4. The transmitter array of claim 3 further comprising:
   a driver circuitry coupled to the primary semiconductor laser and a secondary semiconductor laser of each pixel element for selectively driving one of the primary semiconductor laser and a secondary semiconductor laser for each pixel element.

5. The transmitter array of claim 4 wherein each pixel element includes a plurality of secondary semiconductor lasers and wherein when the primary semiconductor laser is not operating correctly, one of the secondary semiconductor lasers is utilized for transmission.

6. The transmitter array of claim 1 wherein the transmitter array includes a plurality of pixel elements arranged as a one-dimensional array.

7. The transmitter array of claim 1 wherein the transmitter array includes a plurality of pixel elements array arranged as a two-dimensional array.

8. The transmitter array of claim 1 wherein the primary semiconductor laser and the secondary semiconductor laser are Vertical Cavity Surface Emitting Lasers (VCSELs).

9. A transmitter array comprising:
   a plurality of pixel elements;
   wherein each pixel element has at least a primary Vertical Cavity Surface Emitting Laser (VCSEL) and a redundant VCSEL;
   a transmission travel path associated with each pixel element; and
   an alignment mechanism for each pixel element that optically aligns the primary VCSEL and the redundant VCSEL of each pixel element to a corresponding transmission travel path;
   wherein when the primary VCSEL is not operating correctly, the redundant VCSEL is utilized for transmission.

10. The transmitter array of claim 9 wherein the provision of at least one redundant VCSEL element per pixel element increases the manufacturing yield of the transmitter array.

11. The transmitter array of claim 9 wherein each pixel element has two redundant VCSELs; and wherein the primary VCSEL and the two redundant VCSELs are closely packed.

12. The transmitter array of claim 9 wherein each pixel element has three redundant VCSELs; and wherein the primary VCSEL and the three redundant VCSELs are closely packed.

13. The transmitter array of claim 9 wherein each pixel element has N redundant VCSELs; and wherein the primary VCSEL and the N redundant VCSELs are closely packed.

14. The transmitter array of claim 9 wherein the alignment mechanism includes one of an active alignment mechanism and a passive alignment mechanism.

15. The transmitter array of claim 14 further comprising:
   a driver circuitry coupled to the primary Vertical Cavity Surface Emitting Laser (VCSEL) and the redundant VCSEL for selectively driving one of the primary Vertical Cavity Surface Emitting Laser (VCSEL) and a redundant VCSEL.

16. A method for manufacturing a transmitter array having at least a first pixel element with a transmission travel path, comprising:

a) fabricating a primary semiconductor laser in the first pixel element;
b) fabricating at least one secondary semiconductor laser in the first pixel element; and
c) fabricating an alignment mechanism for the first pixel element that optically aligns the primary semiconductor laser and the secondary semiconductor laser of the first pixel element to the transmission travel path, wherein when the primary semiconductor laser is not operating correctly, the secondary semiconductor laser is utilized for transmission.

17. The method of claim 16 further comprising the steps of:
fabricating for the first pixel element a driver circuitry that is coupled to the primary semiconductor laser and a secondary semiconductor laser for selectively driving one of the primary semiconductor laser and a secondary semiconductor laser.

18. The method of claim 16 wherein the step of fabricating a primary semiconductor laser in the first pixel element includes the step of
fabricating a primary Vertical Cavity Surface Emitting Laser (VCSEL) in the first pixel element; and
wherein the step of fabricating at least one secondary semiconductor laser in the first pixel element includes the step of
fabricating at least one secondary Vertical Cavity Surface Emitting Laser (VCSEL) in the first pixel element.

* * * * *